United States Patent
Yi et al.

(10) Patent No.: US 9,419,158 B2
(45) Date of Patent: *Aug. 16, 2016

(54) SOLAR CELL AND METHOD FOR MANUFACTURING SAME

(75) Inventors: Gyuchul Yi, Seoul (KR); Yongjin Kim, Seoul (KR); Chulho Lee, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 414 days.

This patent is subject to a terminal disclaimer.

(21) Appl. No.: 13/881,479

(22) PCT Filed: Oct. 25, 2011

(86) PCT No.: PCT/KR2011/007993
§ 371 (c)(1),
(2), (4) Date: Apr. 25, 2013

(87) PCT Pub. No.: WO2012/057504
PCT Pub. Date: May 3, 2012

(65) Prior Publication Data
US 2013/0213470 A1   Aug. 22, 2013

(30) Foreign Application Priority Data
Oct. 25, 2010  (KR) ........................ 10-2010-0103904

(51) Int. Cl.
| H01L 31/00 | (2006.01) |
|---|---|
| H01L 21/00 | (2006.01) |
| H01L 31/0236 | (2006.01) |
| B82Y 10/00 | (2011.01) |
| H01L 51/42 | (2006.01) |
| H01L 31/0352 | (2006.01) |
| H01L 31/0392 | (2006.01) |
| H01L 31/18 | (2006.01) |
| H01L 51/00 | (2006.01) |

(52) U.S. Cl.
CPC ........... *H01L 31/02366* (2013.01); *B82Y 10/00* (2013.01); *H01L 31/0392* (2013.01); *H01L 31/03529* (2013.01); *H01L 31/035281* (2013.01); *H01L 31/1896* (2013.01); *H01L 51/42* (2013.01); *H01L 51/0045* (2013.01); *Y02E 10/549* (2013.01); *Y02P 70/521* (2015.11)

(58) Field of Classification Search
USPC ........................................... 136/256; 438/71
See application file for complete search history.

(56) References Cited

U.S. PATENT DOCUMENTS

| 2008/0220553 A1* | 9/2008 | Park et al. ........................ 438/30 |
| 2010/0012190 A1* | 1/2010 | Goto et al. .................... 136/261 |
| 2011/0030772 A1* | 2/2011 | Veerasamy ................... 136/256 |

FOREIGN PATENT DOCUMENTS

| JP | 2007-027625 A | 2/2007 |
| JP | 2007-115806 A | 5/2007 |
| JP | 2010-028092 A | 2/2010 |
| KR | 10-0809248 B1 | 2/2008 |

OTHER PUBLICATIONS

Korean Intellectual Property Office, International Search Report in International Patent Application No. PCT/KR2011/007993 (May 24, 2012).

* cited by examiner

*Primary Examiner* — Eli Mekhlin
(74) *Attorney, Agent, or Firm* — Revolution IP, PLLC

(57) ABSTRACT

The invention provides a solar cell and a method for manufacturing same. The solar cell contains a carbon structure layer; a microstructure formed on the carbon structure layer; and a charge separation layer which includes a charge separation junction part and which is formed on the surface of the microstructure.

24 Claims, 11 Drawing Sheets

SOLAR CELL AND METHOD FOR MANUFACTURING SAME

TECHNICAL FIELD

The present invention relates to a solar cell including microstructures formed on a carbon structure layer, and a method for manufacturing the same.

BACKGROUND ART

Lately, due to serious environmental pollution and exhaustion of fossil energy, importance of next-generation clean energy development is increasing. Among clean energy developed so far, solar cells are expected as future energy sources since the solar cell can be used semipermanently without causing environmental pollution, and solar energy resources are limitless.

A solar cell is a device for converting sunlight into electricity. However, since a thin film solar cell has low competitiveness in view of cost, efficiency, etc., it is not widely used.

A representative cause of limiting the efficiency of the solar cell is the structural defect of its composition. That is, when photo-induced carriers, electrons, and holes are trapped and recombined by point defections, dislocation, stacking faults, grain boundaries, etc. in a thin film solar cell, the efficiency of the thin film solar cell becomes limited. Accordingly, if a material without such structural defects is used to manufacture a solar cell, the diffusion distances of carriers, electrons, and holes will increase, which contributes to improvement of the efficiency of a solar cell.

Accordingly, in order to overcome the above problem, a high-efficiency solar cell is needed which can be formed on a large-sized substrate having various properties, at low cost, by a simple manufacturing method.

DISCLOSURE

Technical Problem

The present invention provides a solar cell including a carbon structure layer, more specifically, a solar cell including microstructures formed on a carbon structure layer.

However, objects of the present invention are not limited to the above description, and other objects although not described above, will be clearly understood by one of ordinary skill in the art from the following description.

Technical Solution

In order to achieve the object of the present invention, according to an aspect of the present invention, there is provided a solar cell including: a carbon structure layer; microstructures formed on the carbon structure layer; and a charge separation layer, which is formed on the surface of the microstructures, including a charge separation junction part.

According to another aspect of the present invention, there is provided a method of manufacturing a solar cell, including: preparing a carbon structure layer; growing microstructures on the carbon structure layer; and forming a charge separation layer on the surface of the microstructures.

Advantageous Effects

By forming microstructures having excellent crystallizability on a carbon structure layer, a solar cell having improved electrical and optical properties can be provided, and by increasing the contact area of a charge separation junction part, efficiency of the solar cell can be improved. Also, unlike conventional solar cells, since the solar cell according to the present embodiment includes microstructures formed in a concavo-convex structure, light absorption efficiency can be improved.

Also, since the carbon structure layer of the solar cell can be used as an electrode as well as a substrate, due to its excellent electrical conductivity, and can be easily transferred to another low-cost substrate, it is possible to reduce the manufacturing cost of the solar cell.

BEST MODE FOR CARRYING OUT THE INVENTION

Figure 1:
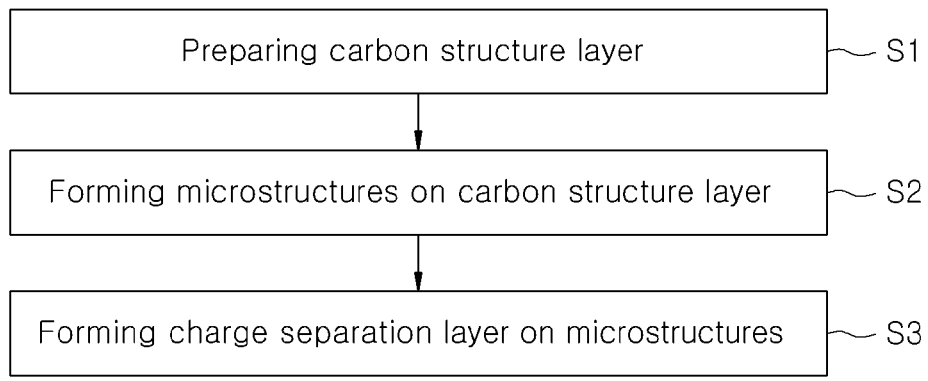
FIG. 1 is a flowchart showing a method of manufacturing a solar cell including microstructures, according to an embodiment of the present invention.
Figure 2A:
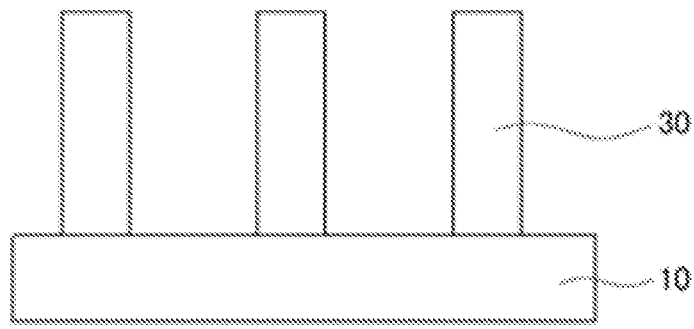
FIG. 2 shows cross-sections of various microstructures according to embodiments of the present invention.
Figure 2B:
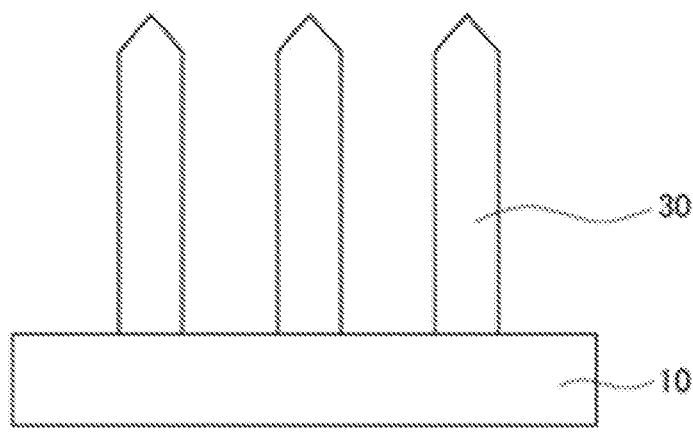
Figure 2C:
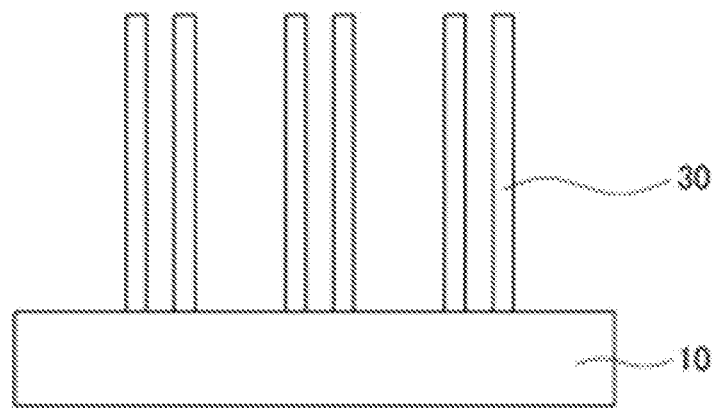
Figure 2D:
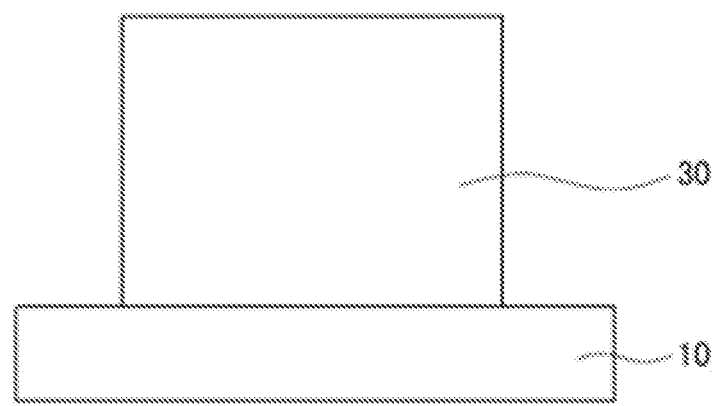

Hereinafter, example embodiments of the present invention will be described in detail so that one of ordinary skill in the art can easily implement the prevent invention.

However, example embodiments of the present invention may be embodied in many alternate forms and should not be construed as limited to example embodiments of the present invention set forth herein. Also, to help understand the present invention, some components are not described and are not shown in the appended drawings. The like numbers refer to like elements throughout this specification.

It will be further understood that the terms "comprises", "comprising", "includes" and/or "including", when used herein, specify the presence of stated components, but do not preclude the presence or addition of one or more other components.

The terms regarding degrees used in this specification, for example, "about", "substantially", etc. should be construed as including the proposed fabrication and material deviation, and are used to prevent unconscientious infringers from illegally using content disclosed as accurate or absolute values for helping understanding of the present invention.

The term "graphene" used in this specification means a layer or sheet formed of graphene which is a polycyclic aromatic molecule configured with a plurality of carbon atoms coupled by covalent binding, wherein the carbon atoms form a six-membered ring as a molecule unit; however, the carbon atoms may form a five-membered ring and/or a seven-membered ring. Accordingly, the graphene is considered as a single layer of carbon atoms subject to covalent binding (generally, sp²-bonding). The graphene may have various structures depending on the content of five-membered rings and/or seven-membered rings that can be contained in the graphene. The graphene may be a single layer as described above, or a plurality of layers formed by stacking a plurality of layers of graphene. Generally, the side end portions of the graphene may be saturated with hydrogen atoms.

A solar cell according to an aspect of the present invention includes a carbon structure layer; microstructures formed on the carbon structure layer; and a charge separation layer including a charge separation junction part formed on the surface of the microstructures.

According to an exemplary embodiment, the solar cell may further include a first electrode layer formed on the charge separation layer; however, the solar cell is not limited to this. According to an exemplary embodiment, the solar cell may further include an insulating layer formed between the carbon structure layer and the first electrode layer; however, the solar cell is not limited to this embodiment. The insulating layer may be formed of oxide (for example, silica, alumina, titania, mullite, cordierite, spinel, zeolite, forsterite, etc.), carbide (for example, boron carbide, etc.), nitride (for example, silicon nitride, boron nitride, and aluminum nitride, etc.), fluoride (for example, magnesium fluoride, aluminum fluoride, etc.), polyolefine polymer (for example, polyvinylphenol (PVP), polyimide (PI), polymethylmethacrylate (PMMA), Polysthylene (PS), polyvinyl alcohol (PVOH), polyvinyleacetate (PVAc), polyisobutylene (PIB), etc.), or their copolymers; however, the insulating layer is not limited to these materials.

According to an exemplary embodiment, the solar cell may further include a second electrode layer formed on the surface of the carbon structure layer; however, the solar cell is not limited to this embodiment. The first electrode layer and/or the second electrode layer may be formed of any conductive material that can be generally used as an electrode by one of ordinary skill in the art. For example, the first electrode layer and/or the second electrode layer may be formed of a metal, transparent conductive oxide (TCO) (for example, indium tin oxide (ITO), indium zinc oxide (IZO), aluminum zinc oxide (AZO), indium zinc tin oxide (IZTO), etc.), conductive polymer, graphene, or graphite, etc. For example, the metal may be Ag, Au, Ni, Ti, Cr, etc.

According to an exemplary embodiment, the carbon structure layer may include graphene or graphite; however, the carbon structure layer is not limited to these embodiments. Also, according to an exemplary embodiment, the graphene or graphite may be a single layer or a plurality of layers; however, the graphene or graphite is not limited to these.

According to an exemplary embodiment, the solar cell may further include a substrate below the carbon structure layer; however, the solar cell is not limited to this embodiment. According to an exemplary embodiment, the carbon structure layer may include any material that can be separated from the substrate and easily transferred onto a target substrate. The substrate may be formed of any material, such as a metal, glass, resin, etc. According to an exemplary embodiment, the substrate may be formed of silicon, silicon carbide, gallium arsenide, spinel, indium phosphide, gallium phosphide, aluminum phosphide, gallium nitride, indium nitride, aluminum nitride, zinc oxide, magnesium oxide, aluminum oxide, titanium oxide, sapphire, quartz, pyrex, or a metal (for example, Au, Pt, Al, Ni, Ti, Pd, and their alloys); however, a material for forming the substrate is not limited to the above-mentioned materials.

According to an exemplary embodiment, the charge separation layer may include a single layer or a plurality of layers; however, the charge separation layer is not limited to these materials.

According to an exemplary embodiment, the solar cell may further include a mask layer disposed between the carbon structure layer and the microstructures and having one or more openings; however, the solar cell is not limited to this. The openings may be formed by applying a method selected from the group consisting of e-beam lithography, photolithography, laser interference lithography, nanoimprint, template, and their combinations, to the mask layer.

According to an exemplary embodiment, the charge separation junction part may be formed on the interface between the microstructures and the thin film and/or on the individual interfaces between the plurality of charge separation layers; however, the location of the charge separation junction part is not limited to these locations.

According to an exemplary embodiment, the microstructures may be selected from the group consisting of micro-bars, micro-needles, micro-tubes, micro-walls, and their combinations; however, the shape of the microstructures is not limited to these structures. For example, the section of the microstructures may be one of various geometrical shapes, such as a polygon (for example, a circle, a triangle, a quadrangle, a pentagon, a hexagon, a heptagon, an octagon, a nonagon, a decagon, a trapezoid, a rhombus, a parallelogram, etc.), a complex figure (for example, an ellipse, a half-moon shape, a crescent-moon shape, a flower shape, a star shape, etc.), a linear trench, a curved trench, etc.; however, the section of the microstructures is not limited to these embodiments.

According to an exemplary embodiment, the microstructures may be formed of at least one of a metal and a semiconductor; however, the material for forming the microstructures is not limited to these. According to an exemplary embodiment, the metal may be selected from the group consisting of Mg, Cd, Ti, Li, Cu, Al, Ni, Y, Ag, Mn, V, Fe, La, Ta, Nb, Ga, In, S, Se, P, As, Co, Cr, B, N, Sb, and their alloys; however, the metal is not limited to the above-mentioned materials. According to an exemplary embodiment, the semiconductor may be a semiconductor based on an oxide, a nitride, a carbide, a III-V group compound, a II-VI group compound, or silicon; however, the semiconductor is not limited to the above-mentioned materials. In more detail, the microstructures may contain at least one material selected from the group consisting of silicon, zinc oxide, zinc magnesium oxide, zinc cadmium oxide, zinc magnesium cadmium oxide, zinc beryllium oxide, zinc magnesium beryllium oxide, zinc manganese oxide, zinc magnesium manganese oxide, gallium oxide, aluminum oxide, gallium aluminum nitride, and indium gallium nitride; however, the material for forming the microstructures is not limited to the above-mentioned materials.

According to an exemplary embodiment, the charge separation layer may be formed of at least one of a metal and a semiconductor; however, the material for forming the charge separation layer is not limited to these. According to an exemplary embodiment, the metal may be selected from the group consisting of Mg, Cd, Ti, Li, Cu, Al, Ni, Y, Ag, Mn, V, Fe, La, Ta, Nb, Ga, In, S, Se, P, As, Co, Cr, B, N, Sb, and their alloys; however, the metal is not limited to the above-mentioned materials. According to an exemplary embodiment, the semiconductor may be a semiconductor based on an oxide, a nitride, a carbide, a III-V group compound, a II-VI group compound, or silicon; however, the semiconductor is not limited to the above-mentioned materials.

According to an exemplary embodiment, the microstructures may be formed on damages on the carbon structure layer; however, the location of the microstructures is not limited to this area. For example, the damages on the carbon structure layer may function as a seed layer on which the microstructures can be grown.

According to an exemplary embodiment, the carbon structure layer may be an electrode of the solar cell; however, the carbon structure layer is not limited to this area. For example, the carbon structure layer may function as a substrate as well as an electrode; however, the functions of the carbon structure layer are not limited to these functions.

According to another aspect of the present invention, a method of manufacturing a solar cell includes: preparing a carbon structure layer; growing microstructures on the carbon structure layer; and forming a charge separation layer on the surface of the microstructures.

According to an exemplary embodiment, the method of manufacturing a solar cell may further include forming a first electrode layer on the charge separation layer. According to an exemplary embodiment, the method of manufacturing a solar cell may further include forming an insulating layer between the carbon structure layer and the first electrode layer before or after forming the charge separation layer; however, the method of manufacturing a solar cell is not limited to these methods.

According to an exemplary embodiment, the method of manufacturing a solar cell may further include forming a second electrode layer on the surface of the carbon structure layer.

According to an exemplary embodiment, the method of manufacturing a solar cell may further include applying a mask layer with one or more openings on the carbon structure layer before growing the microstructures on the carbon structure layer; however, the method of manufacturing a solar cell is not limited to this. According to an exemplary embodiment, the locations of the microstructures may be controlled by the mask layer.

According to an exemplary embodiment, the method of preparing the carbon structure layer may include forming the carbon structure layer on a substrate; however, the method of preparing the carbon structure layer is not limited to this. According to an exemplary embodiment, the method of preparing the carbon structure layer may include transferring a carbon structure layer formed on a substrate to a target substrate; however, the method of preparing the carbon structure layer is not limited to this.

According to an exemplary embodiment, the method of growing the microstructures on the carbon structure layer may include forming damages on the carbon structure layer and forming the microstructures on the damages; however, the method of growing the microstructures on the carbon structure layer is not limited to this. According to an exemplary embodiment, the locations of the microstructures may be controlled by the damages. According to an exemplary embodiment, the damages may be formed by a method selected from the group consisting of gas plasma, ion-beam, e-beam, proton beam, neutron beam, and their combinations; however, methods of forming the damages are not limited to the above-mentioned methods.

According to an exemplary embodiment, the method of forming the damages may include forming a mask layer on the carbon structure layer; patterning the mask layer to form a plurality of openings; and forming the damages on the carbon structure layer through the openings; however, the method of forming the damages is not limited to this method.

According to an exemplary embodiment, the method of patterning the mask layer to form the plurality of openings may be performed by at least one method selected from among e-beam lithography, photolithography, laser interference lithography, nanoimprint, and template; however, the method of patterning the mask layer to form the plurality of openings is not limited to the above-mentioned methods.

Hereinafter, a solar cell, and a method of manufacturing a solar cell, according to embodiments of the present invention, will be described in detail with reference to the appended drawings. However, the present invention is not limited to embodiments described below.

Referring to FIG. 1, the method of manufacturing a solar cell includes: preparing a carbon structure layer 10 (S1); growing microstructures 30 on the carbon structure layer (S2); and forming a charge separation layer on the surface of the microstructures 30 (S3). As an embodiment of the method of manufacturing a solar cell, a solar cell including graphene or graphite will be first described with reference to FIG. 1, below.

First, graphene or graphite is prepared (S1). The graphene or graphite may be prepared as it is, or as a substrate on which graphene or graphite is formed.

As an exemplary embodiment of forming graphene or graphite on a substrate, chemical vapor deposition (CVD) may be used. CVD is a method that has been generally used by one of ordinary skill in the art to form graphene or graphite. For example, CVD may include thermal chemical vapor deposition (T-CVD), rapid thermal chemical vapor deposition (RTCVD), plasma enhanced chemical vapor deposition (PECVD), inductively coupled plasma chemical vapor deposition (ICPCVD), metal organic chemical vapor deposition (MOCVD), low pressure chemical vapor deposition (LPCVD), or atmospheric pressure chemical vapor deposition (APCVD); however, (the) CVD is not limited to the above-mentioned methods. As another exemplary embodiment of forming a graphene layer on a substrate, graphene may be formed by mechanical exfoliation or chemical exfoliation of graphite.

Successively, the microstructures 30 are grown on the graphene or graphite (S2). The microstructures may be formed at any locations on the graphene or graphite. The microstructures, which are micro- or nano-scale structures, have no specific limitation in size or shape. The microstructures may be grown vertically or horizontally (more preferably, vertically) on the graphene or graphite. However, this does not mean that an angle formed by the microstructures and the graphene or graphite is necessarily 90 degrees. The graphene or graphite can be formed by a bottom-up method in which the microstructures are stacked upward with respect to a plate surface from a part in contact with the graphene or graphite as the starting point. The microstructures fabricated by the bottom-up method can be grown as excellent crystalline structures having very low dislocation density in spite of the differences in material constants (lattice constant, thermal expansion coefficient etc.) with respect to graphene or graphite. Accordingly, the microstructures have a better crystallizability than structures fabricated by a top-down method based on thin film deposition and etching.

In more detail, referring to FIG. 2, the solar cell may include various shapes of microstructures. The shapes of the microstructures are not limited so long as they can be generally used by one of ordinary skill in the art. For example, the microstructures may be in the shape of: micro-bars (a), micro-needles (b), micro-tubes (c), or micro-walls (d). Since the solar cell includes the microstructures, the charge separation junction part may be formed on the microstructures which are 3-dimensional structures so that the surface area of the charge separation junction part can be enlarged compared to the conventional technology in which a charge separation junction part is formed on the interface of a thin film. Also, by using the microstructures, it is possible to prevent a phenomenon in which a solar cell has low light absorption efficiency due to total reflection of light since the surface of the solar cell thin film is flat.

Since the surface of graphene or graphite is chemically very stable and has very low reactivity, it is very difficult to grow structures on graphene or graphite. Particularly, it is much more difficult to grow microstructures vertically on graphene or graphite, than to grow microstructures horizontally on graphene or graphite. In the present invention, in order to overcome the problem, as an exemplary embodiment, damages functioning as seeds for growing structures on graphene or graphite are formed on graphene or graphite, and then microstructures are formed on the damages.

A method of forming damages on graphene or graphite is to artificially damage the graphene or graphite by any method that has been generally used by one of ordinary skill in the art. For example, the method may include methods such as gas plasma, ion-beam, e-beam, proton beam, neutron beam, etc. In more detail, the damages may be formed by a method selected from the group consisting of oxygen plasma, argon plasma, nitrogen plasma, hydrocarbon gas plasma, ion-beam plasma, proton beam, neutron beam, and their combinations. Any method capable of adjusting the locations of damages, among the above-mentioned methods, can adjust the locations and density of the microstructures without using a mask layer which will be described later. The damages on the graphene or graphite function to cause nucleation and growth on the graphene or graphite. Also, by adjusting the locations of the damages before the microstructures are grown on the graphene or graphite so as to grow the microstructures only on the damages, it is possible to control the locations of the microstructures on the graphene or graphite.

According to an exemplary embodiment, the shape of the damages may include one selected from the group consisting of a circle, a triangle, a quadrangle, a pentagon, a hexagon, a line, and their combinations; however, the shape of the damages is not limited to these shapes. One or more damages may be formed, and when a plurality of damages is formed, the distances between the damages may be several nanometers or several micrometers. Also, the plurality of damages may have the same shape; however, it is also possible that two or more different shapes of damages are included in the plurality of damages.

Figure 3A:
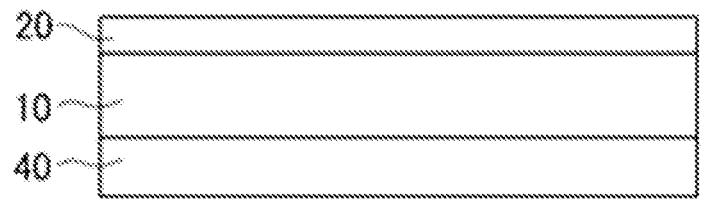
FIG. 3 shows cross-sections for explaining a method of controlling the locations of microstructures using a mask layer with openings, according to an embodiment of the present invention.
Figure 3B:
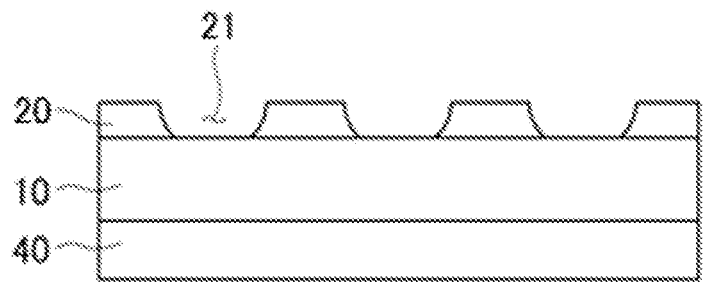

Before the microstructures are formed on the graphene or graphite, the locations of the microstructures may be controlled. Referring to FIG. 3, as an exemplary embodiment of controlling the locations of the microstructures, a mask layer 20 having one or more openings 21 may be used. For example, a mask layer 20 is formed on the graphene or graphite, the mask layer 20 is patterned to form one or more openings 21, and damages are formed through the openings 21 (FIG. 3B). The openings 21 may be formed by a method selected from the group consisting of e-beam lithography, photolithography, laser interference lithography, nanoimprint, template, and their combinations.

Figure 3C:
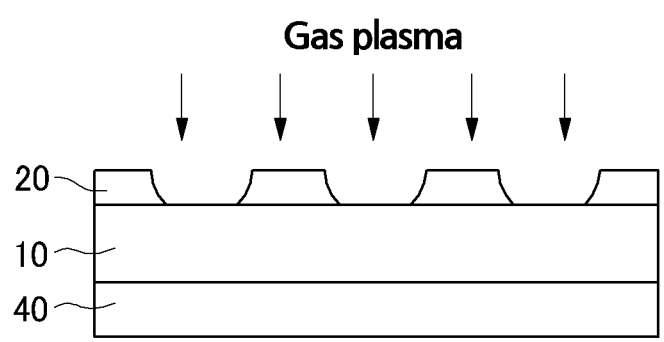
Figure 3D:
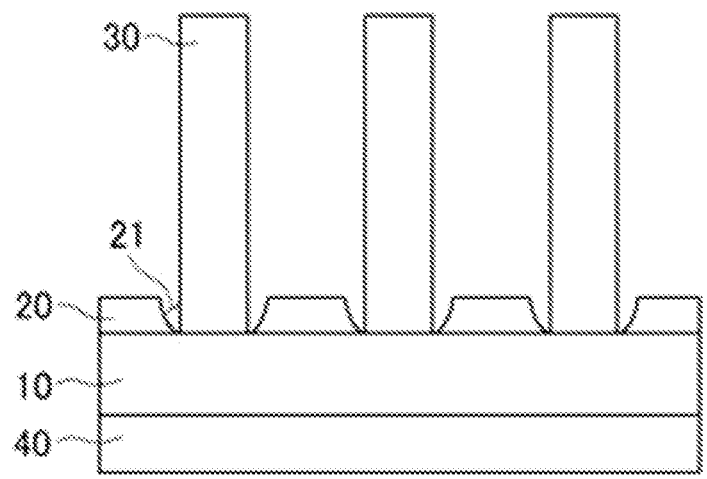
Figure 3E:
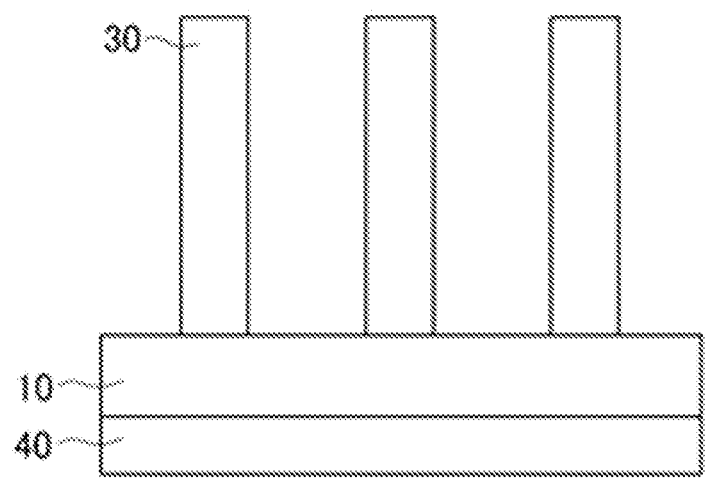

For example, by depositing a mask layer having openings on the graphene or graphite, damages are formed only on the openings of the mask layer by a method such as gas plasma, etc. (FIG. 3C). Thereafter, microstructures may be grown on the damages (FIG. 3D), and by controlling the locations of the openings of the mask layer, the locations of the microstructures may be controlled. The openings 21 may be in the shape of a circle, a triangle, a quadrangle, a pentagon, a hexagon, and a line; however, the shape of the openings 21 is not limited to these shapes. In the case in which the mask layer 20 is used, the method of removing the mask layer 20 after growing the microstructures may be further performed. However, the method of removing the mask layer 20 is not necessarily required, and the mask layer 20 may remain as an insulating layer.

A method of growing the microstructures on the graphene or graphite on which the damages have been formed, includes chemical CVD including metal organic CVD (MOCVD), physical growth, such as sputtering, thermal or electron beam evaporation, pulse laser deposition, etc., a vapor-phase transport process using a metal catalyst such as gold, and so on. More preferably, the MOCVD may be used. If a catalyst-free MOCVD is used, the pollution caused by the catalysts can be prevented during the manufacture of microstructures with excellent electrical and optical performances. The microstructures fabricated by the bottom-up method can be grown as excellent crystalline structures having very low dislocation density in spite of differences in material constants (lattice constant, thermal expansion coefficient etc.) with respect to the substrate. Accordingly, the microstructures have better crystallizability than structures fabricated by a top-down method based on etching. Thus the bottom-up method results in improvement of electrical properties, which contributes to the manufacture of a high-efficiency solar cell.

So far, a method of adjusting the locations and density of microstructures through patterning and/or creation of damages has been described; however, the method of growing microstructures is not limited to this method. For example, it is possible to grow microstructures directly on a carbon structure layer by appropriately selecting process conditions of temperature, pressure, etc.

Successively, charge separation layers 60 are formed of a thin film forming material on the surfaces of the respective microstructures (S3). According to an exemplary embodiment, the charge separation layers 60 may be formed in the coaxial direction of the microstructures. This means that the charge separation layers 60 are formed along at least the side surfaces of the microstructures, as shown in FIG. 4. FIG. 4 shows the case in which the charge separation layers 60 cover all the surfaces of the microstructures; however, there may be no charge separation layers 60 on the upper surfaces of the microstructures so long as the charge separation layers 60 are formed on the side surfaces of the microstructures.

The charge separation layers 60 may be formed of a metal or semiconductor. For example, the metal may be one selected from the group consisting of Mg, Cd, Ti, Li, Cu, Al, Ni, Y, Ag, Mn, V, Fe, La, Ta, Nb, Ga, In, S, Se, P, As, Co, Cr, B, N, Sb, and their alloys; however, the metal is not limited to the above-mentioned materials. Also, the semiconductor may be a semiconductor based on an oxide, a nitride, a carbide, a III-V group compound, a II-VI group compound, or silicon; however, the semiconductor is not limited to the above-mentioned materials.

FIG. 4 is cross-sectional views showing charge separation junction parts 80 of solar cells manufactured by the above-described method.

A charge separation junction part 80 may be configured differently according to the properties of microstructures or a charge separation layer. For example, the charge separation junction part 80 may be a semiconductor p-n junction part, a semiconductor p-i-n junction part, a metal/semiconductor junction part, etc.; however, the charge separation junction part 80 is not limited to these. For example, the microstructures may be an n-type or p-type semiconductor, and the charge separation layer may be a p-type or n-type semiconductor. The n-type semiconductor layer may be formed of a semiconductor material doped with n-type impurities. The n-type impurities may include silicon, germanium, selenium, tellurium, and carbon, and the semiconductor material may include indium nitride, gallium nitride, aluminum nitride, gallium aluminum nitride, and indium gallium nitride. However, the n-type impurities and the semiconductor material are not limited to the above-mentioned materials. Also, the p-type semiconductor layer may be formed of a semiconductor material doped with p-type impurities. The p-type impurities may include magnesium, zinc, and beryllium, and the semiconductor material may include indium nitride, gallium nitride, aluminum nitride, gallium aluminum nitride, and indium gallium nitride. However, the p-type impurities and the semiconductor material are not limited to the above-mentioned materials. For example, the thin film layer may include a silicon semiconductor with n-type impurities that are group V elements, and p-type impurities that are group III elements.

In the case in which the charge separation junction part 80 is formed on the interface between the microstructures and the charge separation layer, the surface area of the charge separation junction part is enlarged compared to the case in which a charge separation junction part is formed on the interface between thin films, resulting in an increase in efficiency of a solar cell.

Figure 4A:
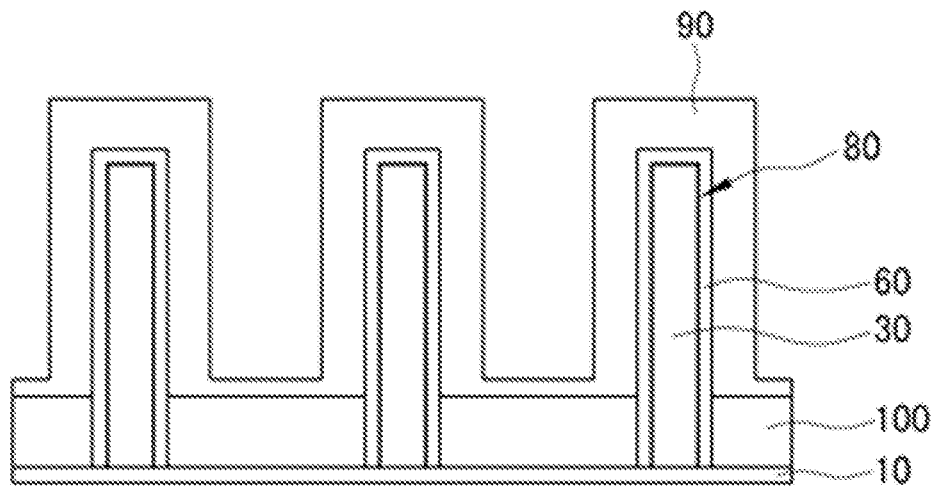
FIG. 4 is cross-sectional views showing charge separation junction parts of solar cells according to embodiments of the present invention.
Figure 4B:
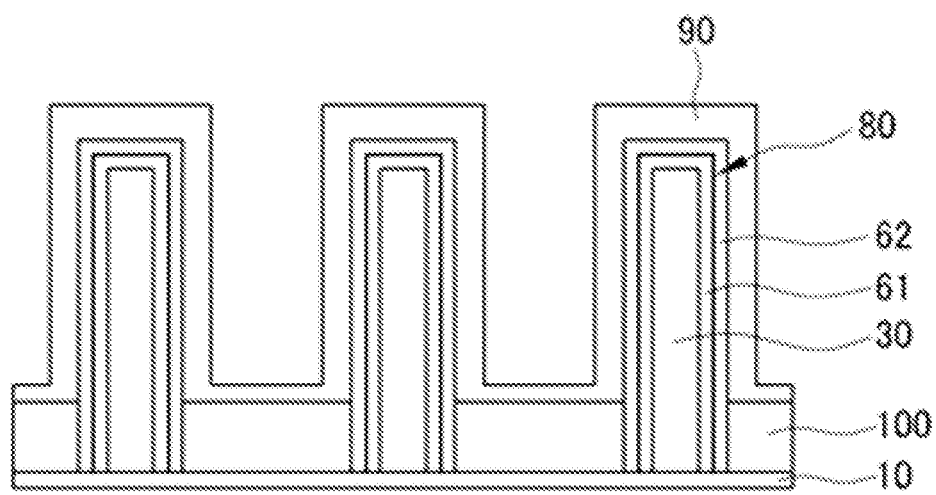

According to an exemplary embodiment, referring to FIG. 4A, in a solar cell according to the present embodiment, a charge separation junction part 80 is formed on the interface between the microstructures 30 and the charge separation layer 60. In this case, the microstructures 30 may be an n-type or p-type semiconductor, or the charge separation layer 60 may be a p-type or n-type semiconductor. As another exemplary embodiment, referring to FIG. 4B, in a solar cell of the present embodiment, a second charge separation layer 62 is applied on a first charge separation layer 61. In this case, a plurality of charge separation junction parts 80 may be provided such that the charge separation junction parts 80 are respectively formed on the interface between the microstructures 30 and the first charge separation layer 61, and on the interface between the first charge separation layer 61 and the second charge separation layer 62. For example, the first charge separation layer may be an n-type or p-type semiconductor, and the second charge separation layer may be a p-type or n-type semiconductor; however, the first and second charge separation layers are not limited to these materials. If a plurality of charge separation layers are stacked as shown in FIG. 4B, a charge separation junction part may be formed on the interface of each charge separation layer.

Electrons are generated from the charge separation layer or the microstructures by sunlight, and the electrons move to a carbon structure layer, which functions as an electrode and resides beneath the charge separation layer. The carbon structure layer is formed of a material having less structural defects, such point defect, dislocation, stacking fault, grain boundary, etc., than a material used as the electrode of a conventional solar cell, thereby facilitating diffusion of photocharges and as a result, improving the efficiency of a solar cell.

Finally, an insulating layer 100 is formed between the individual microstructures on which the first semiconductor layer has been formed, to thus electrically isolate the first electrode layer from the second electrode layer, thereby manufacturing a solar cell. Referring to FIG. 5, the insulating layer 100 may be formed between the carbon structure layer and the first electrode layer before or after forming the charge separation layer.

Figure 5A:
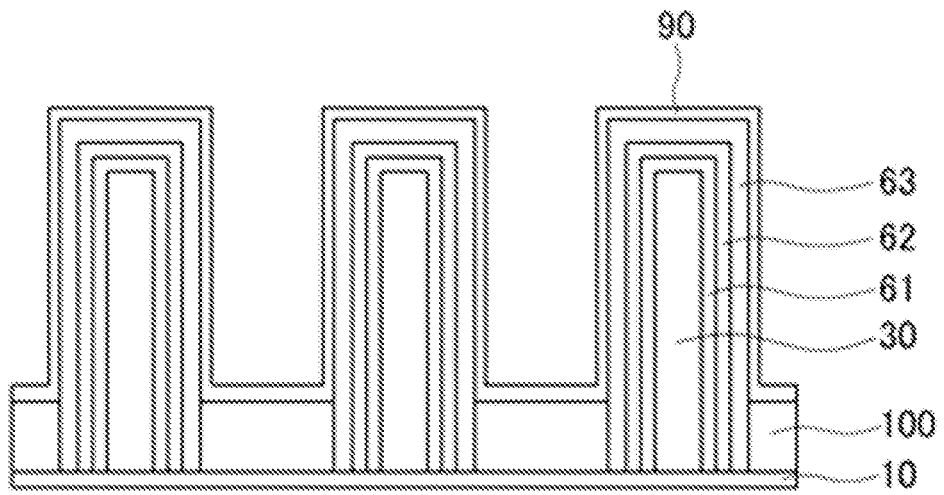
FIG. 5 is cross-sectional views showing insulating layers of solar cells according to embodiments of the present invention.

Referring to FIG. 5A, after a plurality of charge separation layers, for example, first, second, and third charge separation layers 61, 62, and 63 are formed on microstructures 30, the insulating layer 100 is formed, and successively, the first electrode layer 90 is formed, thereby manufacturing a solar cell.

Figure 5B:
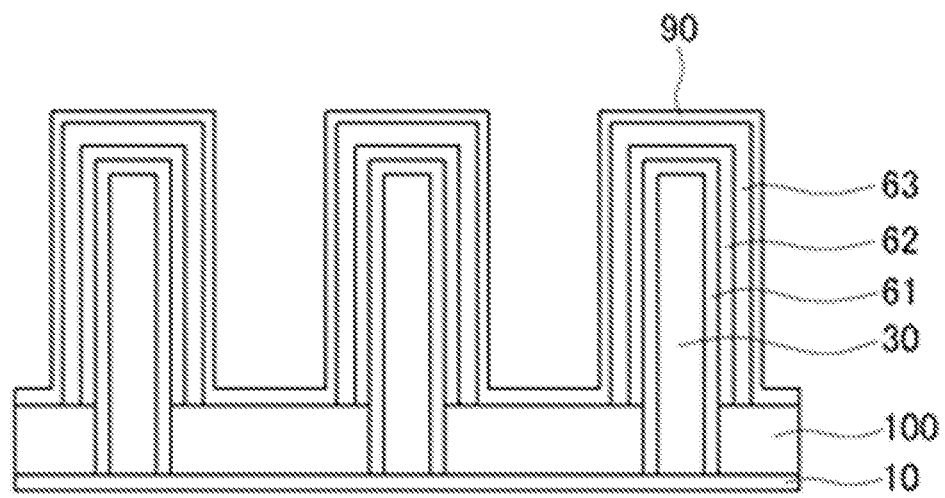

Referring to FIG. 5B, a first charge separation layer 61 is formed on microstructures 30, the insulating layer 100 is formed, and successively, second and third charge separation layers 62 and 63 are formed, thereby manufacturing a solar cell.

Figure 5C:
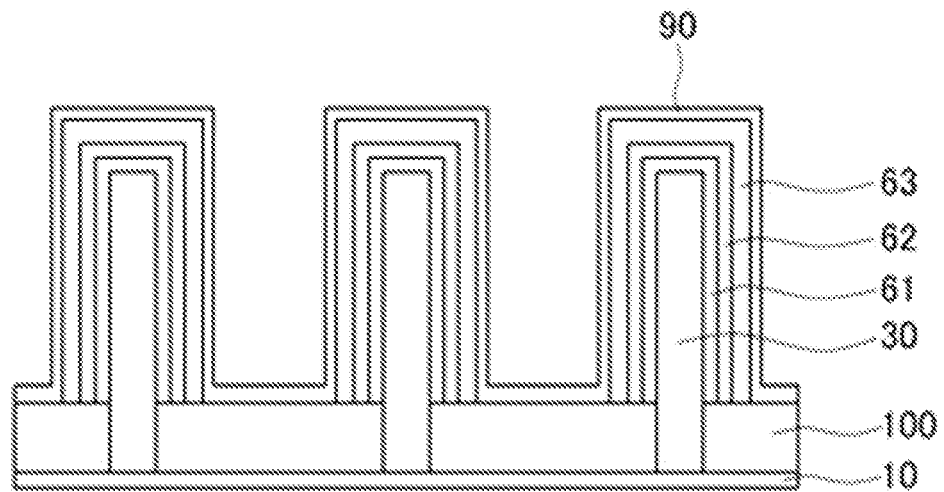

Referring to FIG. 5C, the insulating layer 100 is formed on a carbon structure layer on which microstructures have been formed, and successively, a plurality of charge separation layers are formed on the insulating layer 100, thereby manufacturing a solar cell.

Figure 5D:
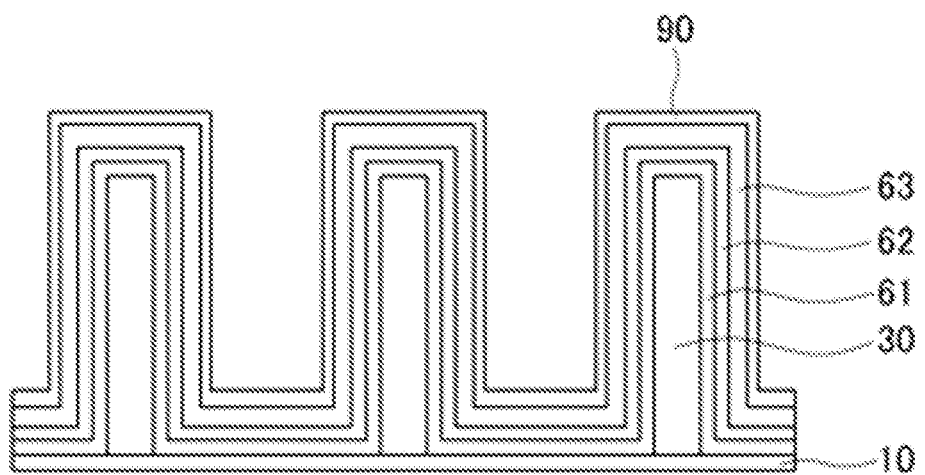

Also, all the embodiments described above include the insulating layer 100; however, the insulating layer 100 may be omitted. For example, as shown in FIG. 5D, if the carbon structure layer 10 does not contact a first electrode layer 90 since a first charge separation layer 61 is formed to cover the upper surface of the carbon structure layer 10, there may be no insulating layer between the carbon structure layer 10 or a second electrode layer (not shown) and the first electrode layer 90.

The material for forming the insulating layer 100 is not limited. For example, the insulating layer 100 may be formed of oxide (for example, silica, alumina, titania, mullite, cordierite, spinel, zeolite, forsterite, etc.), carbide (for example, boron carbide, etc.), nitride (for example, silicon nitride, boron nitride, and aluminum nitride, etc.), fluoride (for example, magnesium fluoride, aluminum fluoride, etc.), polyolefine polymer (for example, polyvinylphenol (PVP), polyimide (PI), polymethylmethacrylate (PMMA), Polysthylene (PS), polyvinyl alcohol (PVOH), polyvinyleacetate (PVAc), polyisobutylene (PIB), etc.), or their copolymers; however, the material for forming the insulating layer 100 is not limited to these.

FIG. 6 shows cross-sections of solar cells with a first electrode layer 90 and a second electrode layer 110 formed at various locations, according to embodiments of the present invention.

Figure 6A:
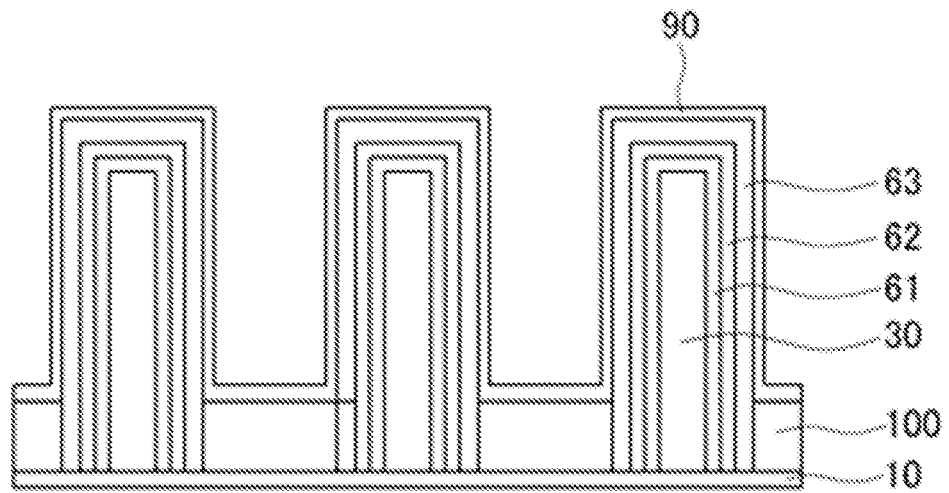
FIG. 6 is cross-sectional views of solar cells with electrodes formed at various locations, according to embodiments of the present invention.
Figure 6B:
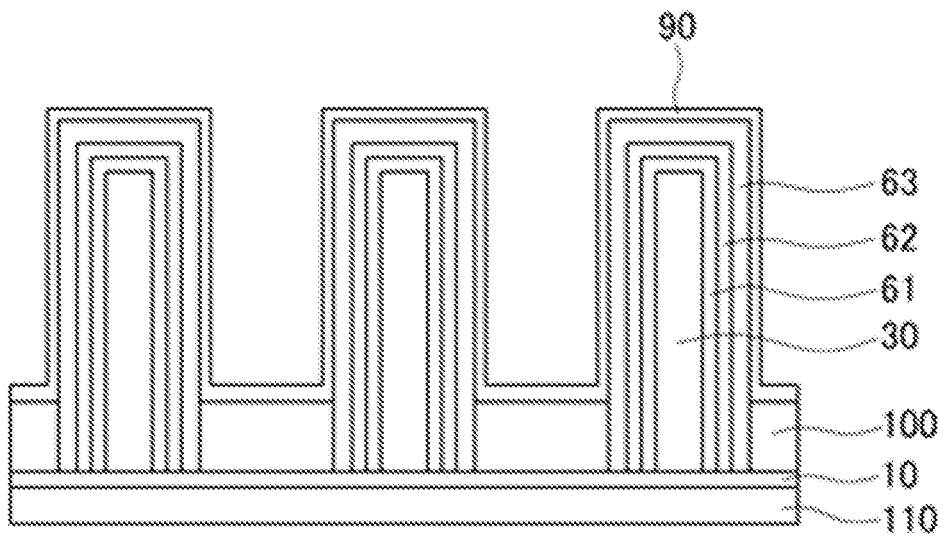
Figure 6C:
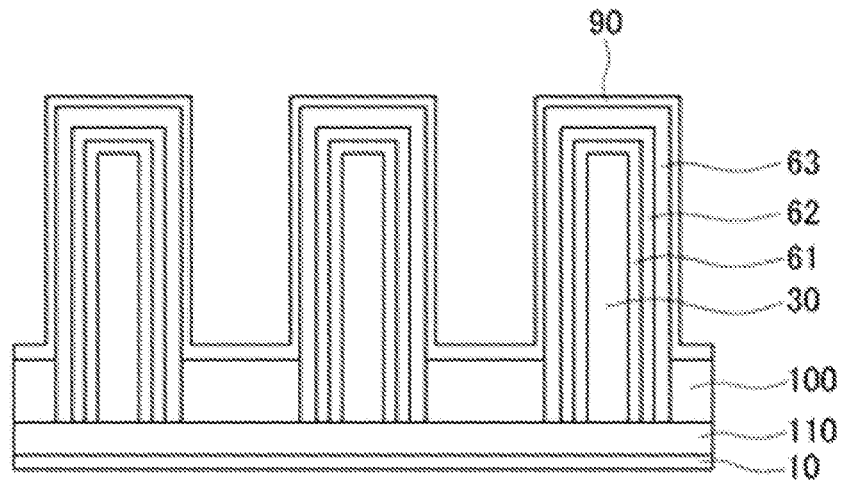
Figure 6D:
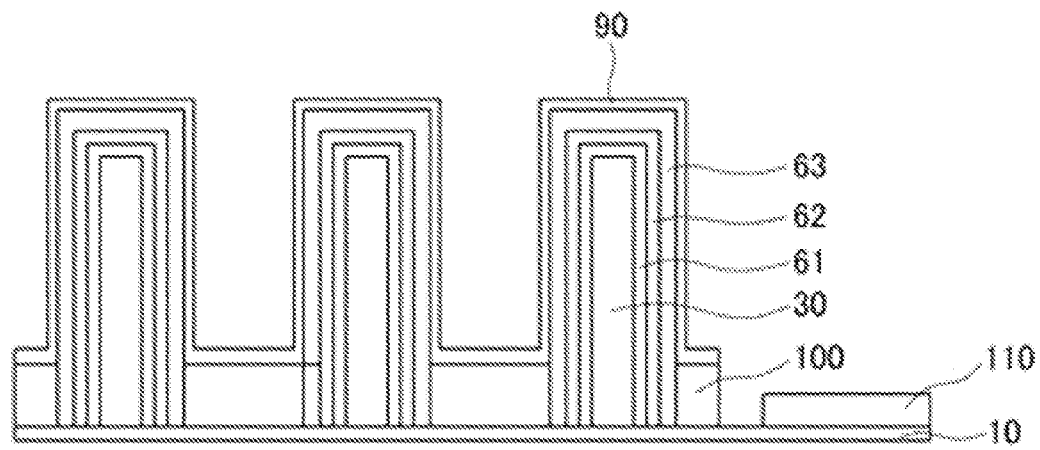

Referring to FIG. 6A, the first electrode layer 90 may be formed on a single or a plurality of charge separation layers 63. Also, a carbon structure layer 10 is itself used as the second electrode layer 110, or a separate second electrode layer 110 may be formed on the carbon structure layer 10. If the carbon structure layer 10 is itself used as the second electrode layer 110, the entire structure is simplified compared to the case of forming a separate electrode layer, resulting in the saving of process cost and time. Meanwhile, if the second electrode layer 110 is formed on the carbon structure layer 10, contact resistance between the carbon structure layer 10 and the electrode layer 110 is low due to the high electrical conductivity of the carbon structure layer 10. Referring to FIGS. 6B through 6D, a first electrode layer 90 may be formed on the surface of a charge separation layer, and a second electrode layer 110 may be formed on the lower surface (FIG. 6B) of a carbon structure layer 10, or on the upper surface (FIG. 6C) of the carbon structure layer 10. Also, the second electrode layer 110 may be formed on the entire lower or upper surface of the carbon structure layer 10, or the second electrode layer 110 may be partially formed on the lower or upper surface of the carbon structure layer 10. In this case, the second electrode layer 110 may be formed at another location, and not in between the carbon structure layer 10 and the insulating layer 100.

Figure 6E:
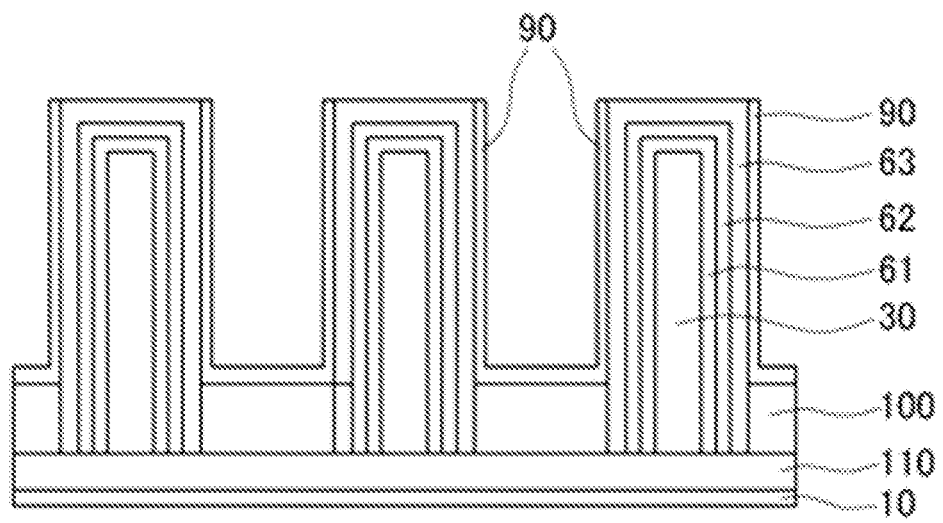

Also, the first electrode layer 90 is partially formed on the charge separation layer. For example, as shown in FIG. 6E, the electrode layer 90 may be formed only on the side surfaces of a third charge separation layer 63, while no electrode layer 90 is formed on the upper surface of the third charge separation layer 63. This structure is useful when the first electrode layer 90 is opaque.

The first electrode layer 90 and/or the second electrode layer 110 described above may be formed in a grid pattern.

Figure 7:
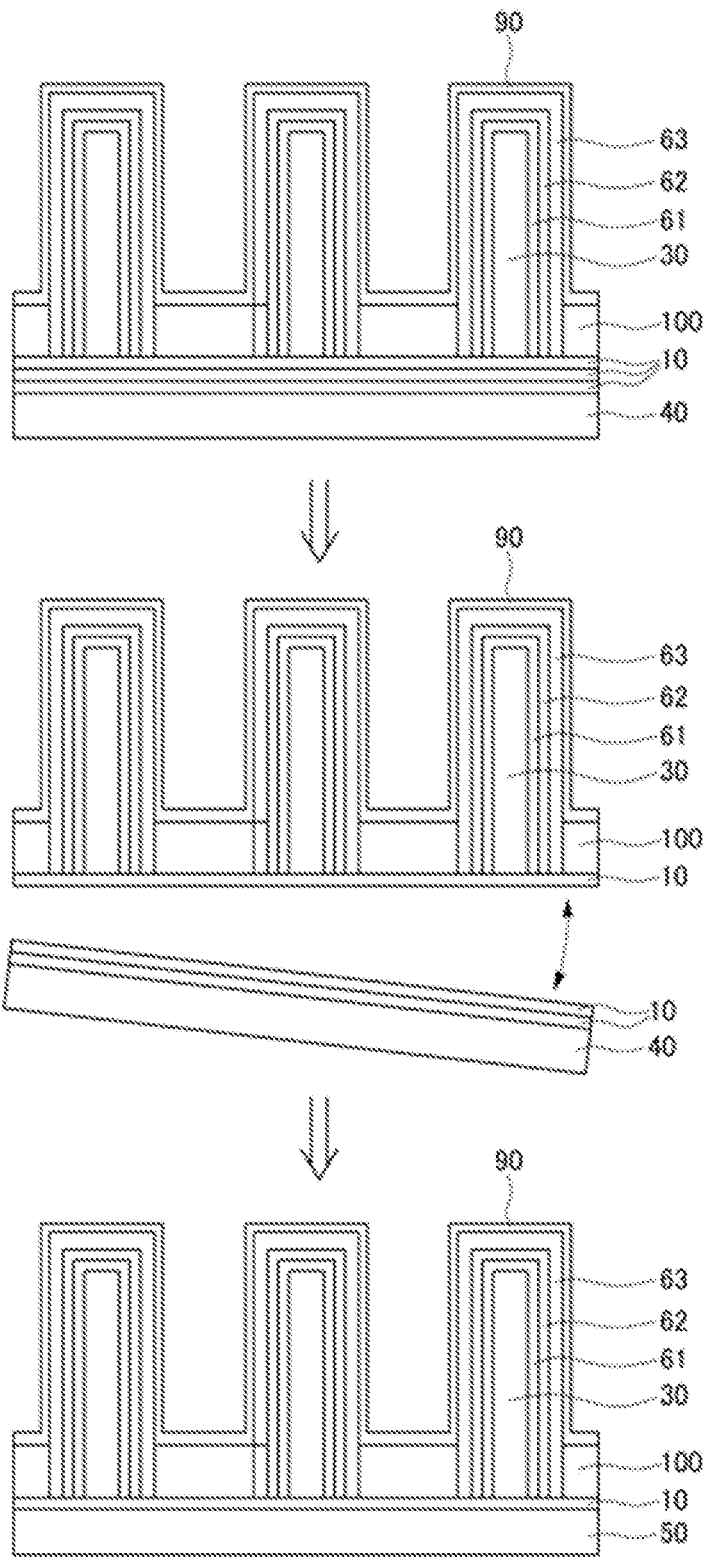
FIG. 7 is a view for explaining a method of transferring a solar cell, according to an embodiment of the present invention.

Referring to FIG. 7, the solar cell according to the current embodiment may be easily transferred onto a target substrate 50. Conventional solar cells have limitation in selecting a substrate due to material constants of materials prepared for growth, deposition, etc. However, since graphene can be easily separated and transferred onto another material, there is no limitation in selecting a substrate, and accordingly, graphene and microstructures formed thereon can be easily separated from an original substrate on which they have been formed, and transferred onto a target substrate 50 having desired properties.

According to an exemplary embodiment, when one or more carbon structure layers 10 are formed, the carbon structure layers 10 may be separated from a substrate 40 on which the carbon structure layers 10 have been formed, and transferred onto a target substrate 50, for example, a flexible, deformable polymer substrate, a transparent substrate, a metallic substrate having excellent thermal conductivity, etc. Particularly, since one or more layers of graphene or graphite have a layered structure, the layers of graphene or graphite may be easily separated from a substrate on which they have been formed.

For example, if a plurality of carbon structure layers 10 are formed, the entire carbon structure layers or a part of the carbon structure layers may be transferred onto a desired target substrate 50.

As described above, a carbon structure layer, for example, graphene is easy to be separated from a substrate and transferred. That is, a carbon structure layer and structures thereon can be separated from a substrate therebeneath, and the separated carbon structure layer and structures thereon can be transferred onto another target substrate. The carbon structure layer can be separated from the substrate by mechanical force, which is called mechanical lift-off.

General solar cells are manufactured on silicon substrates; however, silicon substrates are more expensive than plastic substrates, and also, it is difficult to separate silicon solar cells from silicon substrates and transfer the silicon solar cells. According to the present invention, by forming a solar cell on a relatively low-cost substrate, or transferring a solar cell including a carbon structure layer formed on a silicon substrate onto another low-cost target substrate, it is possible to reduce the manufacturing cost of a solar cell.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

The invention claimed is:

1. A solar cell comprising:
a carbon structure layer;
microstructures formed on the carbon structure layer; and
a charge separation layer, which is formed on the surface of the microstructures, and comprising a charge separation junction part,
wherein the microstructures and the charge separation layer directly contact an upper surface of the carbon structure layer.

2. The solar cell of claim 1, further comprising a substrate disposed on a lower surface of the carbon structure layer.

3. The solar cell of claim 2, wherein the substrate is detachable from the carbon structure.

4. The solar cell of claim 1, wherein the carbon structure layer comprises graphene or graphite.

5. The solar cell of claim 1, further comprising a first electrode layer formed on the charge separation layer.

6. The solar cell of claim 5, further comprising an insulating layer disposed between the carbon structure layer and the first electrode layer.

7. The solar cell of claim 5, further comprising a second electrode layer formed on a lower surface of the carbon structure layer.

8. The solar cell of claim 1, wherein the charge separation layer is a single layer or a plurality of layers.

9. The solar cell of claim 8, wherein the charge separation junction part is formed on an interface between the microstructures and the charge separation layer and/or on an interface of each of the plurality of charge separation layers.

10. The solar cell of claim 1, wherein the microstructures are formed of at least one of a metal and a semiconductor.

11. The solar cell of claim 1, wherein the microstructures are selected from the group consisting of a micro-bar, a micro-needle, a micro-tube, a micro-wall, and their combinations.

12. The solar cell of claim 1, wherein the charge separation layer is formed of at least one of a metal and a semiconductor.

13. The solar cell of claim 1, wherein the microstructures are formed on damages on the carbon structure layer.

14. The solar cell of claim 1, wherein the carbon structure layer is an electrode of the solar cell.

15. A method of manufacturing a solar cell, comprising:
preparing a carbon structure layer;
growing microstructures on the carbon structure layer; and
forming a charge separation layer on the surface of the microstructures,
wherein the microstructures and the charge separation layer directly contact an upper surface of the carbon structure layer.

16. The method of claim 15, further comprising forming a first electrode layer on the charge separation layer.

17. The method of claim 16, further comprising forming an insulating layer between the carbon structure layer and the first electrode layer before or after forming the charge separation layer.

18. The method of claim 16, further comprising forming a second electrode layer on a lower surface of the carbon structure layer.

19. The method of claim 15, wherein the preparing of the carbon structure layer comprises forming the carbon structure layer on a substrate.

20. The method of claim 19, further comprising transferring the carbon structure layer formed on the substrate onto a target substrate.

21. The method of claim 15, wherein the growing of the microstructures on the carbon structure layer comprises forming damages on the carbon structure layer, and forming the microstructures on the damages.

22. The method of claim 21, wherein the damages are formed by a method selected from the group consisting of gas plasma, ion-beam, e-beam, proton beam, neutron beam, and their combinations.

23. The method of claim 21, wherein the forming of the damages comprises:
   forming a mask layer on the carbon structure layer;
   patterning the mask layer to form a plurality of openings; and
   forming the damages on the carbon structure layer through the openings.

24. The method of claim 23, wherein the patterning of the mask layer to form the plurality of openings is performed by at least one method among e-beam lithography, photolithography, laser interference lithography, nanoimprint, and template.

\* \* \* \* \*